United States Patent [19]

Suzuki

[11] Patent Number: 5,223,039
[45] Date of Patent: Jun. 29, 1993

[54] ILLUMINATING APPARATUS AND PHOTO-EXCITED PROCESS APPARATUS USING SAME

[75] Inventor: Nobumasa Suzuki, Yokohama, Japan

[73] Assignee: Canon Kabushiki Kaisha, Tokyo, Japan

[21] Appl. No.: 854,403

[22] Filed: Mar. 19, 1992

[30] Foreign Application Priority Data

Apr. 2, 1991 [JP] Japan .................................. 3-094996

[51] Int. Cl.⁵ .............................................. C23C 16/48
[52] U.S. Cl. .................................... 118/723; 118/723; 427/582; 362/299; 362/346; 359/851; 359/855
[58] Field of Search ................. 118/722, 723; 427/582, 427/583, 584; 359/850, 851, 855, 868; 362/297, 298, 299, 346, 347, 348

[56] References Cited

U.S. PATENT DOCUMENTS 4,202,605  5/1980  Heinz ................... 359/851
4,289,380  9/1981  Tucker .................. 359/851

FOREIGN PATENT DOCUMENTS 360128264   7/1985  Japan ................... 427/584
363216974   9/1988  Japan ................... 427/582
401306567  12/1989  Japan ................... 427/582
0204538    12/1986  United Kingdom .......... 427/582

OTHER PUBLICATIONS

Stanley L. Ream, "Convex Beam Integrator", Laser Focus, vol. 15, No. 11, Nov. 1979, pp. 68-71.

Primary Examiner—Brian E. Hearn
Assistant Examiner—Jonathan D. Baskin
Attorney, Agent, or Firm—Fitzpatrick, Cella, Harper & Scinto

[57] ABSTRACT

An illuminating apparatus includes a light source section; an integrator section for spreading out and making uniform light generated from the light source; and a collimator lens for making the light which is spread out and made uniform by the integrator section a parallel light flux, wherein the integrator section is formed of a reflecting member for reflecting light generated from the light source section toward the collimator lens. A photo-excited process apparatus includes a pressure reduceable vacuum chamber; an exhaust device connected to the vacuum chamber; a gas supplying device for supplying gas used in a photo-excited process into the vacuum chamber; and an illuminating device for applying light to the gas, wherein the illuminating device includes a light source section, an integrator section for spreading out and making uniform light generated from the light source section, and a collimator lens for making light which is spread out and made uniform a parallel light flux, and the integrator section is formed of a reflecting member for reflecting the light generated from the light source section toward the collimator lens.

10 Claims, 3 Drawing Sheets

FIG. 1
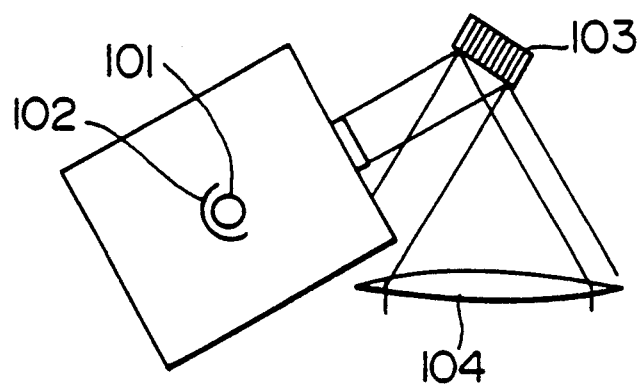
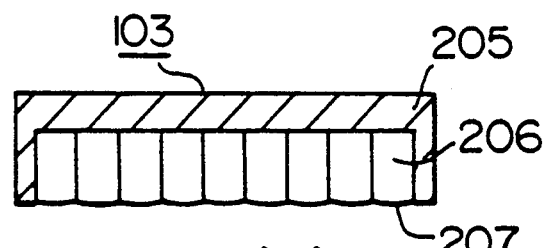
FIG.2(a)
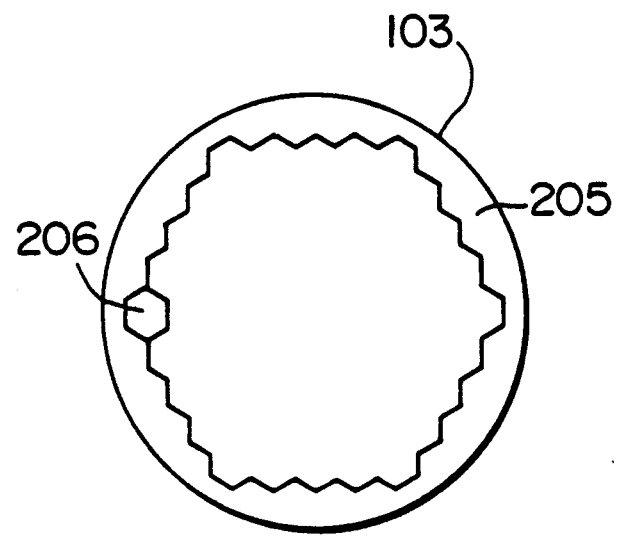
FIG.2(b)

ILLUMINATING APPARATUS AND PHOTO-EXCITED PROCESS APPARATUS USING SAME

BACKGROUND OF THE INVENTION

1. Field of the Invention

The present invention relates to an illuminating apparatus and a photo-excited process apparatus using the same. More particularly, the present invention relates to an illuminating apparatus of a photo-excited process apparatus which is used to manufacture semiconductor elements and electronic circuits and which requires that light having high illuminance be uniformly applied with a small amount of chromatic aberration to a base having a large area.

2. Description of the Related Art

A photo-excited process apparatus is expected to be put into practical use as a manufacturing process semiconductor elements apparatus for semiconductor elements, electronic circuits and, in particular, very-large-scale integrated circuits (VLSIs) because theoretically it can process at low temperatures with little damage. At the present time, a photo-excited process apparatus has come to be applied to a cleaning apparatus or an annealing apparatus, and further applications thereof in a film forming apparatus, an etching apparatus and the like have been considered. In recent years, as VLSI manufacturing processes process bases having larger areas, the illuminating apparatus of the photo-excited process apparatus is also required to process bases having larger areas while at the same time maintaining high illuminance and uniformity.

FIG. 5 is a cross-sectional view which illustrates the construction of a conventional illuminating apparatus used in a photo-excited process apparatus. Shown in FIG. 5 is a multi-lamp array type apparatus which comprises a great number of arranged bar-shaped lamps 501 and a plurality of back mirrors 502, one of each such mirrors being provided on the back of each of the bar-shaped lamps 501. The light generated from each of the lamps 501 is directly guided to, or reflected by, a corresponding back mirror 502 and guided to a process chamber (not shown) disposed below the multi-lamp array.

FIG. 6 is a cross-sectional view which illustrates the construction of another conventional illuminating apparatus used in a photo-excited process apparatus, and also illustrates a fly-eye lens. Light which is generated from a point lamp 601 and made into a substantially parallel light flux by a back mirror 602 provided on the back of the point lamp 601 passes through a fly-eye lens 603 in which very small lenses are arranged two-dimensionally, and then through a collimator lens 604 and guided to a process chamber (not shown) disposed below the fly-eye lens 603. The light flux is enlarged and made uniform as a result of passing through the fly-eye lens 603, and is made a parallel light flux as a result of passing through the collimator lens 604.

However, the prior art has the problems described below. Of the above-described conventional apparatuses, the multi-lamp array type has a high cost because it requires a large number of lamps. The illuminance is sharply decreased when a base to be processed is located away from a lamp to make the illuminance uniform. In the fly-eye lens, since all light generated from the point lamp passes through the fly-eye lens, if the light intensity of the point lamp is increased, the fly-eye lens overheats, causing a cloudiness and transmittance is decreased. Also, since chromatic aberration occurs when a wideband lamp is used, the degree of the uniformity is not constant.

SUMMARY OF THE INVENTION

The present invention has been designed to solve the above-mentioned problems of the prior art.

Accordingly, an object of the present invention is to provide an illuminating apparatus which is capable of uniformly applying high-illuminance light over a wide area.

Another object of the present invention is to provide a photo-excited process apparatus using the above-mentioned illuminating apparatus.

An illuminating apparatus in accordance with the present invention comprises a light source section; an integrator section for enlarging and making uniform light generated from the light source; and a collimator lens for making the light, which is enlarged and made uniform by the integrator section, a parallel light flux, wherein the integrator section is formed of a reflecting member for reflecting light generated from the light source section toward the collimator lens.

A photo-excited process apparatus in accordance with the present invention comprises a pressure reduceable vacuum chamber; exhaust means connected to the vacuum chamber; gas supplying means for supplying gas used in a photo-excited process into the vacuum chamber; and illuminating means for applying light to the gas, wherein the illuminating means comprises a light source section, an integrator section for enlarging and making uniform light generated from the light source section, and a collimator lens for making light, which is enlarged and made uniform, a parallel light flux, and the integrator section is formed of a reflecting member for reflecting the light generated from the light source section toward the collimator lens.

In the illuminating apparatus of the present invention, the light intensity thereof is not decreased considerably, and chromatic aberration does not occur. As a consequence, the intensity of light generated from a lamp can be increased to a high illuminance which can be applied uniformly on a wide area.

In the photo-excited process apparatus of the present invention, since light having high illuminance is used uniformly, as light for photo-excitation, over a wide area, a photo-excited process can be performed always stably and a high speed, thus effecting a high-performance process.

In the present invention, the integrator section may be formed of a plurality of elements each having a reflection surface which has a diffusion function. Each of the elements may be arranged in such a manner that the reflection surfaces are arrayed in a periodic manner.

In the present invention, since the integrator section for enlarging and making uniform light is formed of a reflecting member, it is not heated by light generated from the light source section. An illuminating apparatus for a photo-excited process having a small amount of chromatic aberration, in which the light intensity is not decreased even if the intensity of the lamp is increased, is made possible by using an integrator section which is made up of reflection optical elements in which parts of spherical surfaces having radiuses of 5 to 100 mm are periodically arranged in place of the conventional fly-eye lens.

The aforementioned and other objects, features and advantages of the present invention will become clear when reference is made to the following description of the preferred embodiments of the present invention, together with reference to the accompanying drawings.

BRIEF DESCRIPTION OF THE DRAWINGS

FIG. 1 is a schematic view which illustrates an example of an illuminating apparatus of the present invention;

FIG. 2(a) is a schematic sectional view of a mirror integrator 103 shown in FIG. 1;

FIG. 2(b) is a schematic plan view illustrating the mirror integrator 103;

DETAILED DESCRIPTION OF THE PREFERRED EMBODIMENTS

Figure 3:
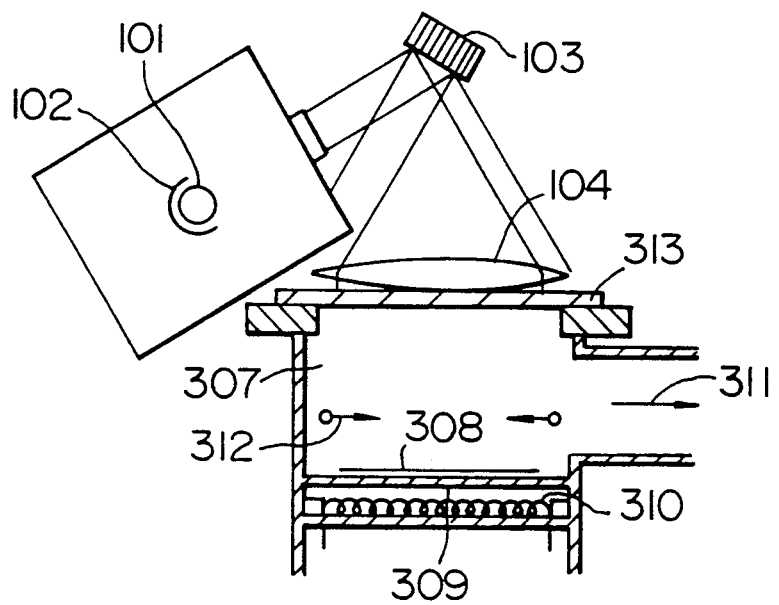
FIG. 3 is a schematic view which illustrates an example in which a photo-excited process apparatus of the present invention is applied to an optical CVD apparatus.

Preferred embodiments of the present invention will be explained below with reference to the accompanying drawings.

First Embodiment

FIG. 1 is a schematic view which illustrates the construction of an illuminating apparatus according to the first embodiment of the present invention.

An illuminating apparatus of this embodiment comprises a lamp 101, a back mirror 102, disposed in the back of the lamp 101, which, together with the lamp 101, constitutes a light source section, a mirror integrator 103 which is an integrator section for spreading out, making uniform and reflecting light received directly from the lamp 101, or light reflected by the back mirror 102, and a collimator lens 104 for making light reflected by the mirror integrator 103 to be a substantially parallel light flux.

FIG. 2(a) is a schematic sectional view illustrating the construction of a mirror integrator 103 shown in FIG. 1; and FIG. 2(b) is a schematic plan view illustrating the mirror integrator 103.

The mirror integrator 103 for spreading out and making uniform light and reflecting the light comprises a plurality of elements 206 in the shape of a hexagonal prism, the surface of each of which elements is formed into a reflection surface 207, and cases 205 for holding each of the elements 206 in such a manner as to contact each element on the side thereof. In FIG. 2(b), for simplicity, only one element 206 is shown. The reflection surface 207 which is the top surface of each of the elements 206 is rounded in order for the reflected light to diffuse. As a result, reflection surfaces 207 which have a diffusion function are periodically arranged on the reflection surface serving as the mirror integrator 103. As a consequence, light which is generated from the lamp 101, reflected by the mirror integrator 103 and made to enter the collimator lens 104 is spread out and made uniform. The light is made to be a parallel light flux as a result of passing through the collimator lens 104 and made to enter the process chamber.

In this embodiment, since light is spread out and made uniform by causing the light to be reflected by such a mirror integrator 103 as that described above, the illuminance of the lamp can be increased, and light having high illuminance can be efficiently and uniformly applied to a large-area base.

A point light source is preferable for the lamp 101. A selection may be made depending upon an application from a high-pressure Hg lamp, a Xe-Hg lamp, a Xe lamp and the like. A high-pressure Hg lamp is used in this embodiment. A mirror which changes light generated from the lamp 101 to a parallel light flux is desirable for the back mirror 102. When a laser having a parallel light flux is used as a light source, the back mirror 102 is unnecessary.

An embodiment has been explained in which the reflection surface of the mirror integrator 103 is formed of a plurality of reflection surfaces 207 of a plurality of elements 206. This is for the purpose of facilitating manufacturing while at the same time each reflection surface is made to have a predetermined accuracy. The method of manufacturing mirror integrators is not limited to this method. Mirror integrators may be manufactured in such a way that a mirror is deposited after periodical reflection surfaces similar to that described above are molded.

Regarding the shape of each reflection surface 207 of each of the elements 206 which constitute the mirror integrator 103, a spherical surface is preferable because it can be manufactured easily. The radius of each spherical surface is mostly determined by the size of a base and the distance between the mirror integrator 103 and the collimator lens 104, which is approximately 5 to 100 mm. When, for example, the size of each element 206 is 6 mm, that of the base is $\phi 6''$, and the distance between the mirror integrator 103 and the collimator lens 104 is 350 mm, the radius is preferably approximately 28 mm. The shape of each element 206 of the mirror integrator 103 is not limited to the shape of a hexagonal prism as in this embodiment, but may be in the shape of a circle. However, to make reflected light uniform, a shape in which the elements 206 are most densely packed (for example, the shape of a hexagonal prism or a prism as in this embodiment) is preferable. For the material of the reflection surface 207, various metals, and in particular, Al having a high reflection index in the visible ultraviolet regions is preferable. In such a case, Al may be deposited on a metal and used.

Second Embodiment
Next, an embodiment in which the present invention is applied to an optical CVD apparatus will be explained with reference to FIG. 3.

Light which is generated from the lamp 101 is made a uniform parallel light flux by the mirror integrator 103 and the collimator lens 104. The light is guided into a pressure reduceable reaction chamber 307 through a light introduction window 313 having a quartz property. A base 308 is placed on a supporting body 309 which is heated by a heater 310 disposed in the lower section of the reaction chamber 307. A feedstock gas 312 used for a process is introduced from a gas introduction pipe in the shape of a ring disposed inside the reaction chamber 307 in the vicinity of the base 308, causing a reaction on the base 308. The gas which is not used in the reaction is discharged from the reaction chamber 307 through a discharge system 311.

Next, a film forming operation of this embodiment will be explained. First, the base 308 is placed on the supporting body 309. Then, an electric current is made to flow through the heater 310 so as to heat the base 308 to a desired temperature between room temperature and several hundred ° C. Next, the feedstock gas 312 is made to flow, and the reaction chamber 307 is maintained at a desired pressure between 0.1 to 100 Torr by a conductance valve (not shown) disposed in the discharge system 311. Thereafter, the lamp 101 is lit, and the film forming operation is performed until a desired film thickness is obtained.

A high-pressure mercury lamp is used for the lamp 101. $Si_2H_6$ and $NH_3$ are supplied, as the feedstock gas 312, from the ring-shaped gas introduction pipe at the ratios of 20 and 200 sccm, respectively. The film forming operation is performed on a $\phi 6''$ board under the following conditions: a pressure of 5 Torr, a board temperature of 300° C., and an illuminance of 130 mW/cm$^2$. As a result, a good-quality SiN film is formed at a relatively high speed of 20 nm/min. with a uniformity of ±3%.

A film may be formed from an insulator, such as SiN, $SiO_2$, $Ta_2O_5$, $Al_2O_3$ or AlN, from a semiconductor, such as a-Si, poly-Si or GaAs, or from a metal, such as Al or W.

Third Embodiment

Figure 4:
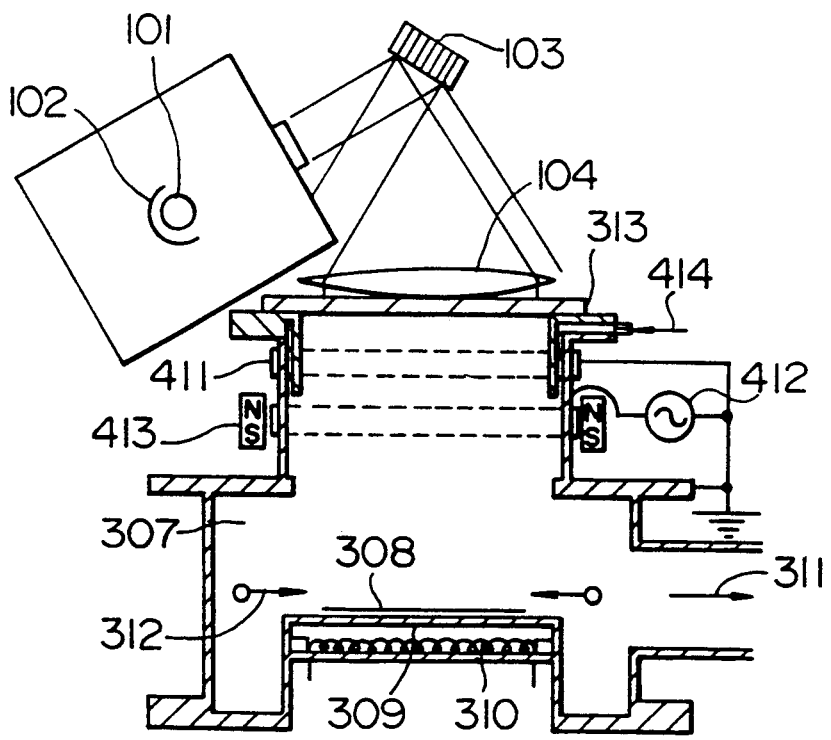
FIG. 4 is a schematic view which illustrates an example in which a photo-excited process apparatus of the present invention is applied to a photo-assisted plasma CVD apparatus.
Figure 5:
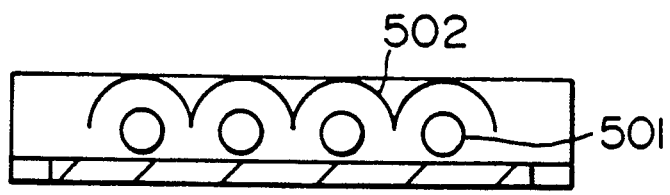
FIG. 5 is a schematic view which illustrates the construction of a conventional multi-lamp array type.
Figure 6:
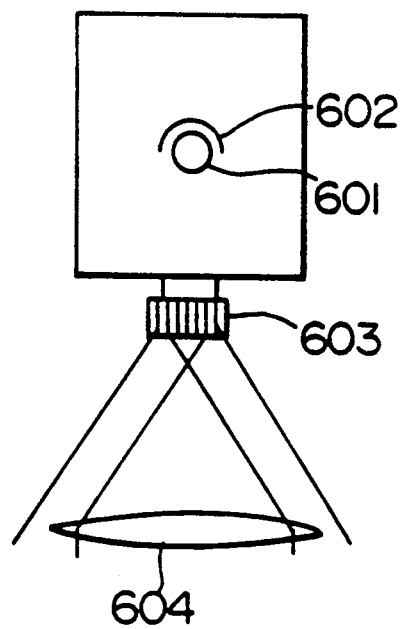
FIG. 6 is a schematic view which illustrates the construction of a conventional fly-eye lens.

Next, an embodiment in which the present invention is applied to a photo-assisted CVD apparatus will be explained with reference to FIG. 4.

In this embodiment, a ring-shaped high-frequency electrode 411, which is a plasma generating means and which receives electric power from a high-frequency power supply 412, is wound around the outer circumference of the reaction chamber 307. A magnet 413 for generating a magnetic field perpendicular to the electric field formed in the vicinity of the high-frequency electrode 411 is also disposed around the reaction chamber 307. Regarding the feedstock gas used to process the base 308, the following two gases are used: the feedstock gas 312 introduced from a portion inside the reaction chamber 307 near the base 308 as shown in the embodiment in FIG. 3; and a second feedstock gas 414 which is introduced from the upper portion of the reaction chamber 307 so as to pass through a region where a plasma is generated and reach the base 308. As the rest of the components of the second embodiment are the same as those of the first embodiment, they are given the same reference numerals as those given to the like components in the first embodiment, and an explanation thereof is omitted.

Next, a film forming operation of this embodiment will be explained. First, the base 308 is placed on the supporting body 309. The lamp 101 is lit and an electric current is made to flow through the heater 310, causing the base 308 to be heated to a desired temperature between room temperature and several hundred ° C. Next, the feedstock gas 312 and the second feedstock gas 414 are made to flow, and the reaction chamber 307 is maintained at a desired pressure between 10 m Torr and 1 Torr by a conductance valve (not shown) disposed on the side of the discharge system 311. A high-frequency power generated by the high-frequency power supply 412 is supplied to the high-frequency electrode 411 in a several-hundred G magnetron magnetic field generated by the magnet 413, thus generating a plasma locally present in the vicinity of the high-frequency electrode 411. The film forming operation is performed until a desired film thickness is obtained.

A Xe lamp is used for the lamp 101. Tetraethylorthosilicate (TEOS), as the feedstock gas 312, and $O_2$, as the second feedstock gas 414, are supplied in the ratios of 100 and 500 sccm, respectively. The film forming operation is performed on a $\phi 6''$ board under the following conditions: a pressure of 0.1 Torr, a board temperature of 300° C., an illuminance of 0.6 W/cm$^2$, a high-frequency power of 500 W, and a magnetic-flux density of 130 G. As a result, a good-quality $SiO_2$ film having a hydrogen content of not greater than 1 atm% and a tensile stress of $2 \times 10^8$ dyne/cm$^2$ is formed at a relatively high speed of 180 nm/min. with a uniformity of ±3%.

A film may be formed from an insulator, such as SiN, $SiO_2$, $Ta_2O_5$, $Al_2O_3$ or AlN, from a semiconductor, such as a-Si, poly-Si or GaAs, or from a metal, such as Al or W.

Concerning the above measured values, densities are determined by the reflection index measured by ellipsometry, the composition ratio is measured by Auger electron spectroscopy and Lorentz-Lorentz's formula; hydrogen content is determined by dividing the absorptivities of the Si-H and N-H bands in the infrared absorption spectrum by the absorption coefficient; and stress is determined by the changes in the warp of the base before and after the film was formed, which were measured by an interferometer.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included with the spirit and scope of the claims. The following claims are to be accorded a broad interpretation, so as to encompass all such modifications and equivalent structures and functions.

What is claimed is:

1. An illuminating apparatus, comprising: a light source section;
   an integrator section for spreading out and making uniform light generated from the light source; and
   a collimator lens for making the light which is spread out and made uniform by the integrator section a parallel light flux,
   wherein the integrator section is formed of a reflecting member for reflecting light generated from the light source section toward the collimator lens.

2. An illuminating apparatus according to claim 1, wherein the integrator section comprises a plurality of elements each having a reflection surface which has a spreading function, and wherein each of the elements is arranged in such a manner that the reflection surfaces of respective elements are arrayed in a periodic manner.

3. An illuminating apparatus according to claim 2, wherein the integrator section comprises optical elements in which parts of spherical surfaces having radiuses of 5 to 100 mm are periodically arranged.

4. An illuminating apparatus according to claim 3, wherein the reflection surfaces of the optical elements are formed by deposition.

5. An illuminating apparatus according to claim 4, wherein materials used in said deposition are composed of Al.

6. A photo-excited process apparatus, comprising:

a pressure reduceable vacuum chamber;
exhaust means connected to the vacuum chamber;
gas supplying means for supplying gas used in a photo-excited process into the vacuum chamber; and
illuminating means for applying light to the gas,
wherein the illuminating means comprises a light source section, an integrator section for spreading out and making uniform light generated from the light source section, and a collimator lens for making light which is spread out and made uniform a parallel light flux, and wherein the integrator section is formed of a reflecting member for reflecting the light generated from the light source section toward the collimator lens.

7. A photo-excited process apparatus according to claim 6, wherein the integrator section is formed of a plurality of elements each having a reflection surface which has a spreading function, and each of the elements is arranged in such a manner that the reflection surfaces of respective elements are arrayed in a periodic manner.

8. A photo-excited process apparatus according to claim 7, wherein the integrator section comprises optical elements in which parts of spherical surfaces having radiuses of 5 to 100 mm are periodically arranged.

9. A photo-excited process apparatus according to claim 8, wherein the spherical surfaces of the optical elements are formed by deposition.

10. A photo-excited process apparatus according to claim 9, wherein materials used in said deposition are made of Al.

* * * * *

UNITED STATES PATENT AND TRADEMARK OFFICE
CERTIFICATE OF CORRECTION

PATENT NO. : 5,223,039
DATED : June 29, 1993
INVENTOR(S) : Nobumasa Suzuki

It is certified that error appears in the above-indentified patent and that said Letters Patent is hereby corrected as shown below:

Title page, item
[56] REFERENCES CITED

OTHER PUBLICATIONS:
"Convex" should read --A Convex--.

COLUMN 2
Line 50, "and" should read --and at--.

COLUMN 4
Line 51, "Embodiment Next" should read --Embodiment ¶ Next,--.

COLUMN 6
Line 37, "with" should read --within--.
Line 42, "comprising: a" should read --comprising: ¶ a--.
Line 63, "reflection" should read --spherical--.

Signed and Sealed this

Fifth Day of April, 1994

BRUCE LEHMAN

Attest:

Attesting Officer

Commissioner of Patents and Trademarks